United States Patent
Shiraga et al.

(10) Patent No.: US 10,153,169 B2
(45) Date of Patent: Dec. 11, 2018

(54) METHOD OF CONTROLLING THRESHOLD OF TRANSISTOR AND METHOD OF MANUFACTURING SEMICONDUCTOR DEVICE

(71) Applicant: TOKYO ELECTRON LIMITED, Tokyo (JP)

(72) Inventors: Kentaro Shiraga, Yamanashi (JP); Koji Akiyama, Yamanashi (JP); Junya Miyahara, Yamanashi (JP); Yutaka Fujino, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/423,460

(22) Filed: Feb. 2, 2017

(65) Prior Publication Data
US 2017/0221716 A1   Aug. 3, 2017

(30) Foreign Application Priority Data

Feb. 2, 2016  (JP) ................. 2016-017680

(51) Int. Cl.
| H01L 21/00 | (2006.01) |
| H01L 21/28 | (2006.01) |
| H01L 21/321 | (2006.01) |
| H01L 29/49 | (2006.01) |
| H01L 29/51 | (2006.01) |
| H01L 21/8238 | (2006.01) |

(52) U.S. Cl.
CPC ...... *H01L 21/28088* (2013.01); *H01L 21/321* (2013.01); *H01L 21/823842* (2013.01); *H01L 21/823857* (2013.01); *H01L 29/4966* (2013.01); *H01L 29/517* (2013.01)

(58) Field of Classification Search
CPC ............ H01L 21/28088; H01L 21/321; H01L 21/823842; H01L 21/823857; H01L 29/4966; H01L 29/517
See application file for complete search history.

(56) References Cited

U.S. PATENT DOCUMENTS

2012/0094505 A1 * 4/2012 Nakamura ........ H01J 37/32192
438/771

FOREIGN PATENT DOCUMENTS

| JP | 2015/060867 | 3/2015 |
| KR | 10-2012-0035927 A | 4/2012 |
| KR | 10-2014-0035680 A | 3/2014 |
| KR | 10-2014-0123993 A | 10/2014 |

* cited by examiner

*Primary Examiner* — Richard A Booth

(57) ABSTRACT

In a method of controlling a threshold of a transistor, a gate insulating film is formed in a channel region of a metal-oxide-semiconductor (MOS) transistor on a main surface of a semiconductor substrate. A first electrode layer is formed on the gate insulating film and a second electrode layer containing a work function adjusting metal is formed on the first electrode layer. Thereafter, an oxidation treatment or nitridation treatment using a microwave plasma processing apparatus is performed to inactivate the work function adjusting metal, thereby executing a threshold control of the MOS transistor.

16 Claims, 15 Drawing Sheets

METHOD OF CONTROLLING THRESHOLD OF TRANSISTOR AND METHOD OF MANUFACTURING SEMICONDUCTOR DEVICE

CROSS-REFERENCE TO RELATED APPLICATIONS

This application claims priority to Japanese Patent Application No. 2016-017680 filed on Feb. 2, 2016, the entire contents of which is incorporated herein by reference.

FIELD OF THE INVENTION

The present disclosure relates to a method of controlling a threshold of a metal-oxide-semiconductor (MOS) transistor, and a method of manufacturing a semiconductor device.

BACKGROUND OF THE INVENTION

Along with the miniaturization of semiconductor devices, a gate electrode structure for a complementary metal-oxide-semiconductor (CMOS) transistor has been shifting from polysilicon/$SiO_2$ to metal/high dielectric constant material (high-k material). Specifically, a gate insulating film made of a high-k material such as $HfO_2$ or the like is formed on the main surface of a semiconductor substrate (Si substrate), a first electrode layer made of a TiN film or the like serving as a cap is formed on the gate insulating film, a second electrode layer made of an AlTi film or the like containing Al as a work function metal is formed on the first electrode layer, and a third electrode layer made of a TiN film or the like serving as a barrier and a fourth electrode layer made of W are formed on the second electrode layer, thereby forming a laminate for p-channel and n-channel gate electrodes.

In this case, it is necessary to control a threshold of the transistor. As a technique for controlling the threshold of the transistor, there has been known a technique in which a composition ratio of Al contained as a work function metal in the second electrode layer of the laminate for the gate electrode is changed in a pMOS region and a nMOS region (see, e.g., Japanese Patent Application Publication No. 2015-060867). The threshold may also be controlled by changing the thickness of the TiN film used as a cap between the pMOS region and the nMOS region.

However, in the technique of changing the composition ratio of the work function metal in the pMOS region and the nMOS region disclosed in Japanese Patent Application Publication No. 2015-060867, after forming a TiAl film containing Al which is a work function metal, Al is diffused into a TiN film thereunder by lamp annealing to change the threshold of the transistor, but it requires a complicated operation. Further, in the technique of changing the thickness of the TiN film serving as a cap, it is necessary to perform the film formation in the gate electrode laminate of the pMOS region and the film formation in the gate electrode laminate of the nMOS region in separate steps. Therefore, in both techniques, the number of steps increases, which is complicated and high in cost. Further, if the miniaturization further progresses, it is expected that the thickness of the TiN film as a cap is further reduced, and it becomes difficult to control the threshold by changing the thickness of the TiN film.

SUMMARY OF THE INVENTION

In view of the above, the present disclosure provides a method of controlling a threshold of a transistor, capable of controlling a threshold of a MOS transistor without difficulty while suppressing an increase in the number of steps, and a method of manufacturing a semiconductor device using the same.

In accordance with a first aspect, there is provided a method of controlling a threshold of a transistor, the method including: forming a gate insulating film in a channel region of a metal-oxide-semiconductor (MOS) transistor on a main surface of a semiconductor substrate; forming a first electrode layer on the gate insulating film; forming a second electrode layer containing a work function adjusting metal on the first electrode layer; and thereafter, performing an oxidation treatment or nitridation treatment using a microwave plasma processing apparatus to inactivate the work function adjusting metal and perform a threshold control of the MOS transistor.

In accordance with a second aspect, there is provided a method of manufacturing a semiconductor device, the method including: preparing a semiconductor substrate having on its main surface a first region in which a first conductive type channel is formed and a second region in which a second conductive type channel is formed; forming a gate insulating film in the first region and the second region; forming a first electrode layer on the gate insulating film; forming a second electrode layer containing a work function adjusting metal on the first electrode layer; and performing an oxidation treatment or nitridation treatment only on the first region of the second electrode layer by using a microwave plasma processing apparatus to inactivate the work function adjusting metal.

BRIEF DESCRIPTION OF THE DRAWINGS

The objects and features of the present disclosure will become apparent from the following description of embodiments, given in conjunction with the accompanying drawings, in which:

FIGS. 19A to 19C show the results of X-ray photoelectron spectroscopy (XPS) analysis in a depth direction from the barrier TiN film side to the Si substrate side with respect to the laminate when the oxidation treatment time of the TiAl film using the microwave plasma processing apparatus is changed, wherein FIG. 19A shows the result of the processing time: 0 sec, FIG. 19B shows the result of the processing time: 10 sec, and FIG. 19C shows the result of the processing time: 40 sec;

DETAILED DESCRIPTION OF THE EMBODIMENTS

Hereinafter, embodiments of the present disclosure will be described in detail with reference to the accompanying drawings which form a part hereof.

Manufacturing Method of CMOS Transistor

Figure 1:
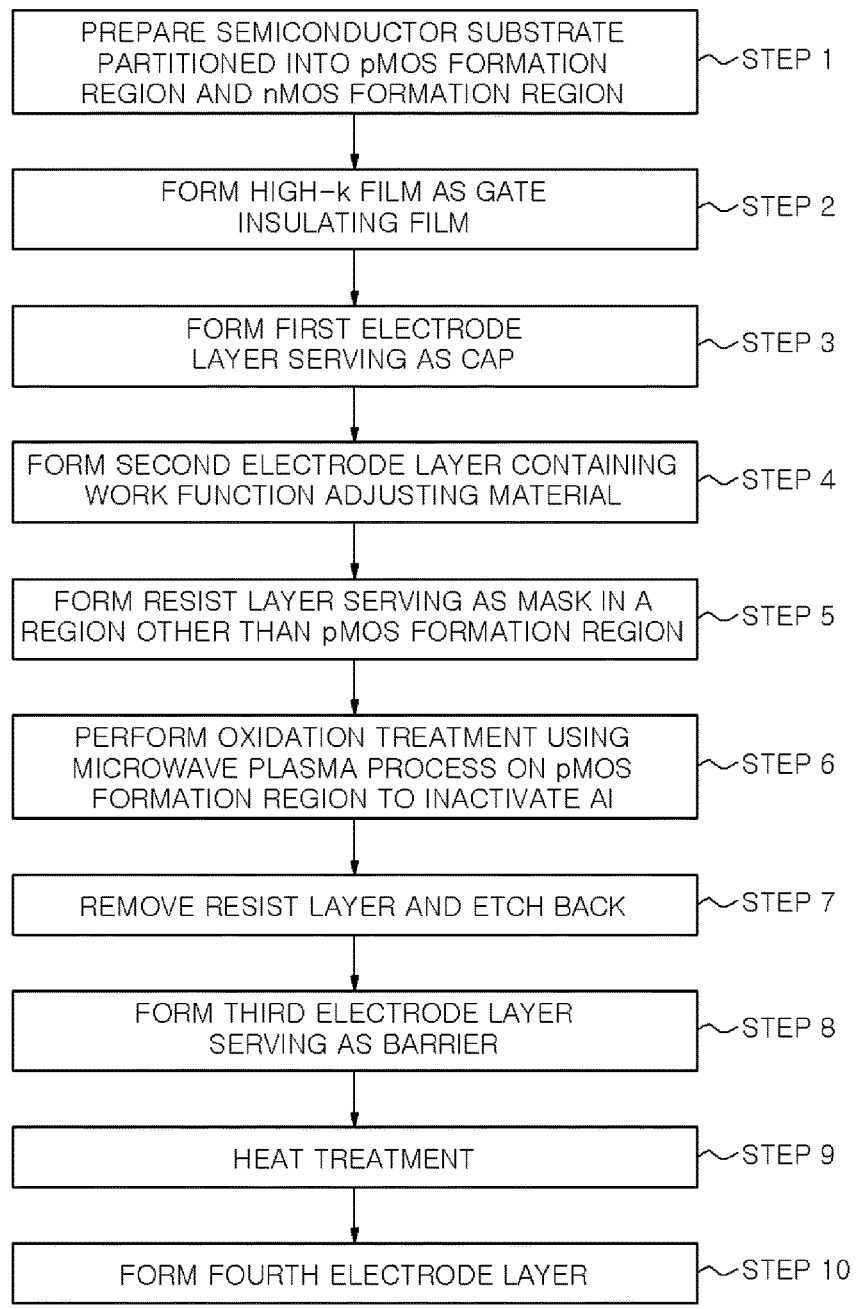
FIG. 1 is a flowchart explaining an example of a method of manufacturing a CMOS transistor, to which a method of controlling a threshold of a transistor according to the present disclosure is applied.

First, an example of a method of manufacturing a CMOS transistor, to which a method of controlling a threshold of a transistor according to the present disclosure is applied, will be described. FIG. 1 is a flowchart explaining a method of manufacturing a CMOS transistor. FIGS. 2 to 10 are cross-sectional views schematically showing the respective steps of the method.

Figure 2:
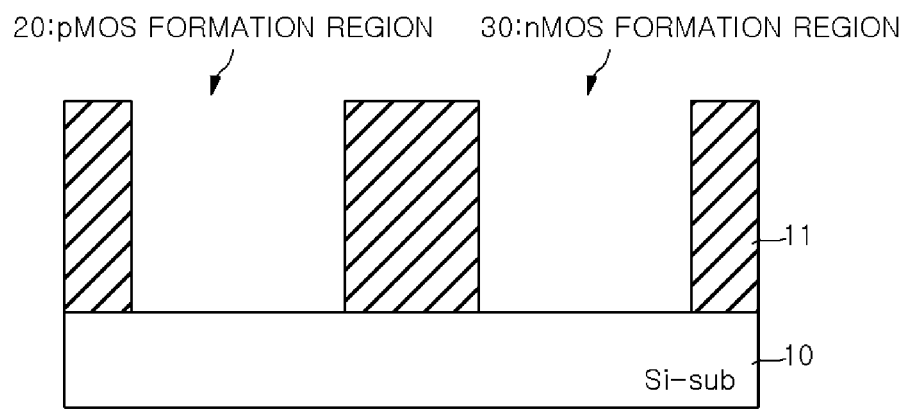
FIG. 2 is a cross-sectional view schematically showing step 1 of the CMOS transistor manufacturing method of FIG. 1.

First, as shown in FIG. 2, a semiconductor substrate 10, on which an element isolation region 11 is formed and which is partitioned into a pMOS formation region 20 where a p-channel is formed and a nMOS formation region 30 where a n-channel is formed, is prepared, and pre-cleaning using diluted hydrofluoric acid or the like is performed on the surface of the substrate (step 1). As the semiconductor substrate 10, a Si substrate may be suitably used, but it is not limited thereto, and Ge, SiGe, or InGaAs may be used. In addition, SOI or GOI may be used as the semiconductor substrate 10.

Figure 3:
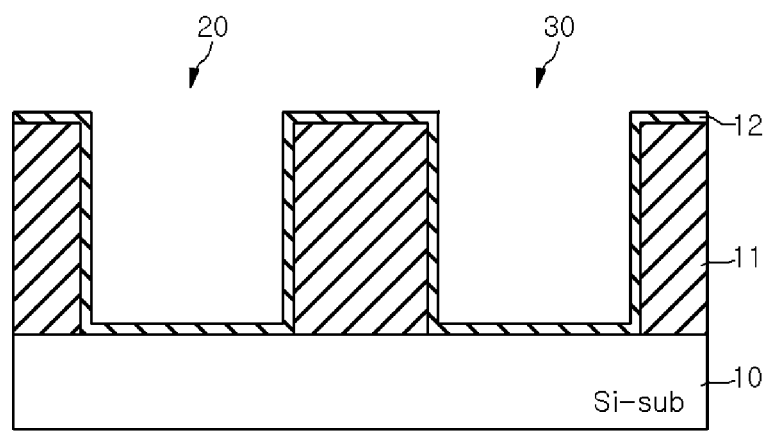
FIG. 3 is a cross-sectional view schematically showing step 2 of the CMOS transistor manufacturing method of FIG. 1.

Next, as shown in FIG. 3, a high-k film is formed as a gate insulating film 12 on the entire top surface including a main surface of the semiconductor substrate 10 (step 2). As the high-k film, a $HfO_2$ film may be suitably used. The $HfO_2$ film is formed by atomic layer deposition (ALD) using an appropriate Hf-containing compound gas and an oxidizing agent. In this case, the deposition temperature preferably ranges from 100 to 400° C., and the film thickness preferably ranges from 1 to 5 nm. For example, the deposition temperature is 300° C. and the film thickness is 3.5 nm. As the high-k film, $ZrO_2$ or $Al_2O_3$ may also be used. Further, the high-k film may be formed on an underlying film such as $SiO_2$ film or the like formed on the semiconductor substrate 10.

Figure 4:
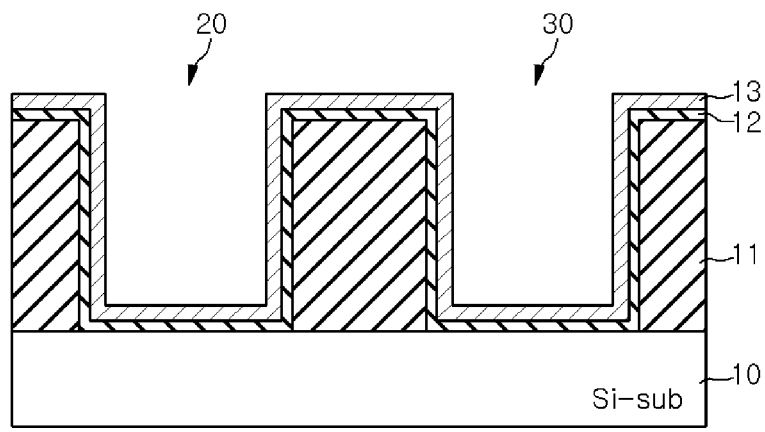
FIG. 4 is a cross-sectional view schematically showing step 3 of the CMOS transistor manufacturing method of FIG. 1.

Next, as shown in FIG. 4, a first electrode layer 13 serving as a cap is formed on the gate insulating film 12 (step 3). The first electrode layer 13 is made of a TiN film and is formed by physical vapor deposition (PVD). The TiN film is formed by sputtering using an inert gas such as Ar gas or the like as a processing gas while a pressure at room temperature is set to 0.5 to 10 Pa, e.g., 0.5 Pa, and a high frequency power applied to a target is set to 30 to 300 W, e.g., 100 W. The film thickness is preferably 10 nm or less, e.g., 1 nm. In addition to PVD, the TiN film may be formed by chemical vapor deposition (CVD) or ALD. As the first electrode layer 13, a TaN film may also be used.

Figure 5:
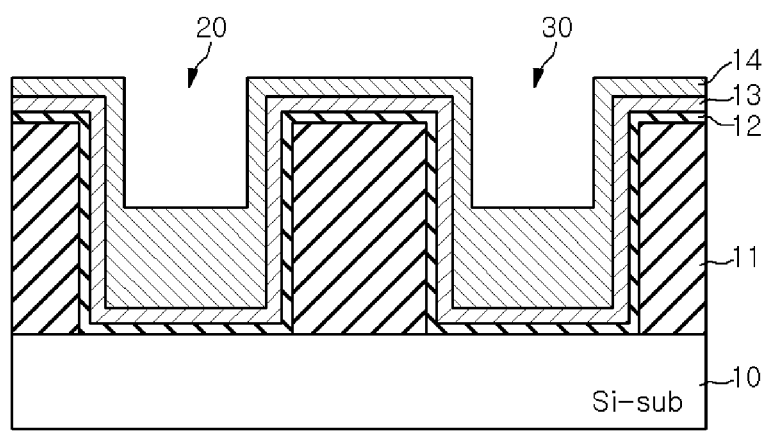
FIG. 5 is a cross-sectional view schematically showing step 4 of the CMOS transistor manufacturing method of FIG. 1.

Next, as shown in FIG. 5, a second electrode layer 14 containing a work function adjusting metal is formed on the first electrode layer 13 (step 4). The second electrode layer 14 is made of a TiAl film containing Al as a work function adjusting metal and is formed by PVD. The TiAl film is formed by sputtering using an inert gas such as Ar gas or the like as a processing gas while a pressure at room temperature is set to 0.5 to 10 Pa, e.g., 1 Pa, and a high frequency power applied to a target is set to 30 to 300 W, e.g., 100 W. The film thickness is preferably 0.1 to 10 nm, e.g., 3 nm. In addition to PVD, the TiAl film may be formed by CVD or ALD. As the second electrode layer 14, instead of the TiAl film, a Ti film or an Al film may be used. In the case of a Ti film, Ti is a work function adjusting metal. Further, a TiN film as a cap may be further formed on the second electrode layer 14 to have a film thickness of 5 nm or less, e.g., 1 nm.

Figure 6:
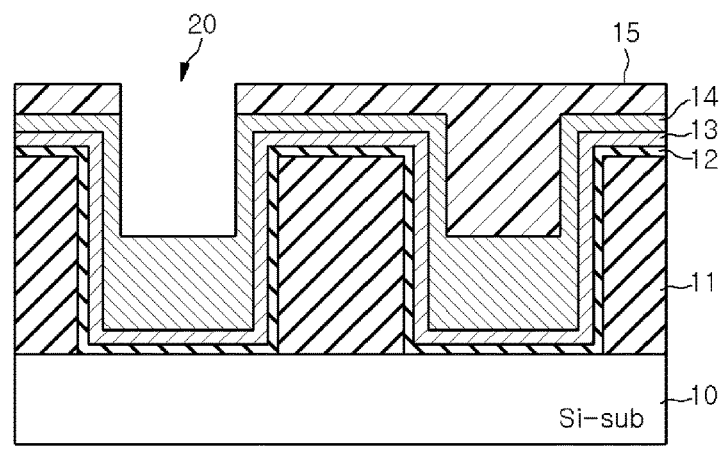
FIG. 6 is a cross-sectional view schematically showing step 5 of the CMOS transistor manufacturing method of FIG. 1.

Next, as shown in FIG. 6, a resist layer 15 serving as a mask is formed in a region other than the pMOS formation region 20 by photolithography (step 5).

Figure 7:
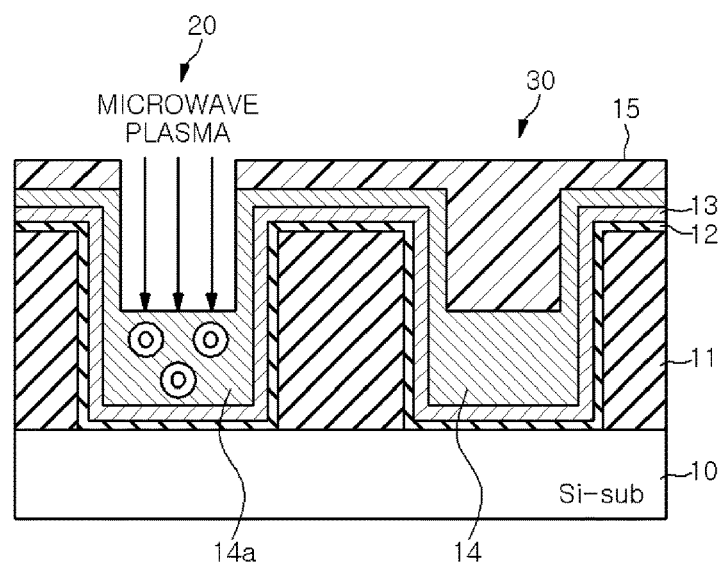
FIG. 7 is a cross-sectional view schematically showing step 6 of the CMOS transistor manufacturing method of FIG. 1.

Next, as shown in FIG. 7, an oxidation treatment is performed on the pMOS formation region 20 by a microwave plasma to selectively oxidize the second electrode layer 14 of the pMOS formation region 20 to form an oxidized layer 14a, and Al serving as the work function adjusting metal is inactivated (step 6). Accordingly, a threshold control of the CMOS transistor is performed as described later. The second electrode layer 14 of the pMOS formation region 20 may be selectively nitrided by a nitridation treatment using a microwave plasma, instead of the oxidation treatment using a microwave plasma, to form a nitrided layer and may be inactivated. Alternatively, the oxidation treatment or nitridation treatment using a microwave plasma may be performed using another mask instead of the resist layer 15.

Alternatively, both the pMOS formation region 20 and the nMOS formation region 30 are subjected to the oxidation treatment or nitridation treatment using a microwave plasma, and the threshold control may be performed such that the amount of oxygen or nitrogen to be added is larger in the pMOS formation region 20 than in the nMOS formation region 30. In this case, the amount of oxygen or nitrogen to be added may be controlled by the time of the oxidation treatment or nitridation treatment without using a mask, or by adjusting the material or thickness of the mask such that the amount of oxygen or nitrogen to be added is larger in the pMOS formation region.

Figure 8:
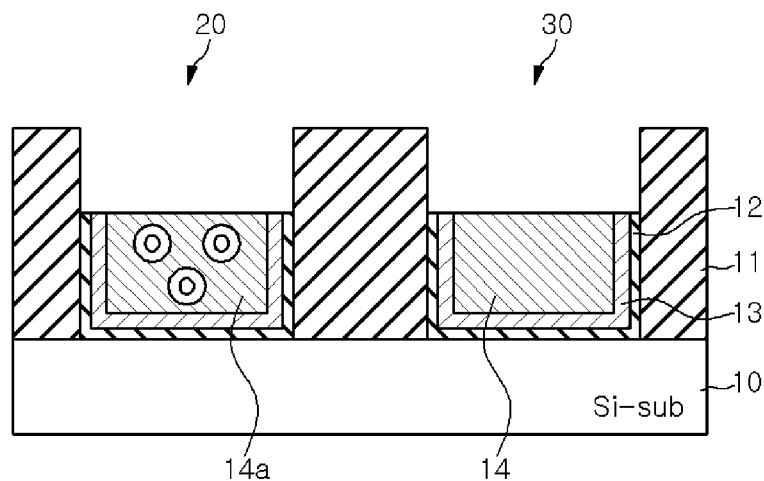
FIG. 8 is a cross-sectional view schematically showing step 7 of the CMOS transistor manufacturing method of FIG. 1.

Next, as shown in FIG. 8, the resist layer 15 is removed, and the second electrode layer 14 and the oxidized layer (nitrided layer) 14a and the like are etched back (step 7).

Figure 9:
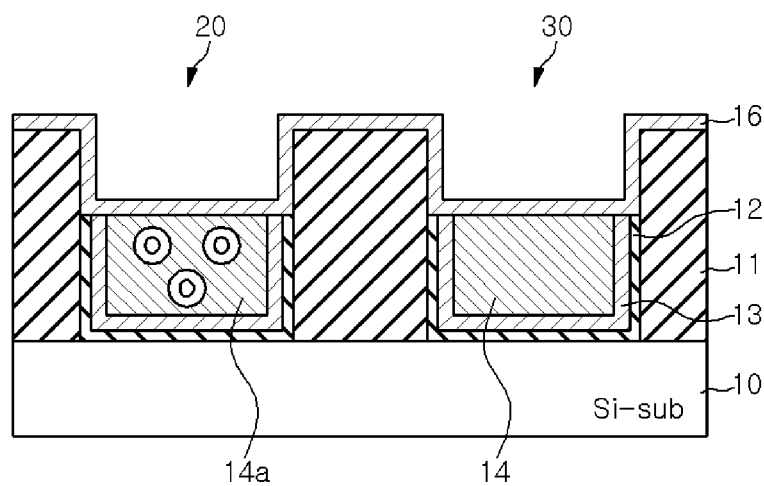
FIG. 9 is a cross-sectional view schematically showing step 8 of the CMOS transistor manufacturing method of FIG. 1.

Next, as shown in FIG. 9, a third electrode layer 16 serving as a barrier is formed on the entire top surface (step 8). The third electrode layer 16 is made of a TiN film and is formed by PVD under the same conditions as those of the first electrode layer 13. The film formation may be performed by CVD or ALD. The film thickness is preferably 1 to 50 nm, e.g., 30 nm. As the third electrode layer 16, a TaN film may also be used.

Next, after forming the third electrode layer 16, a heat treatment is performed preferably in a temperature range of 300 to 500° C., e.g., 400° C., for 5 to 180 min, e.g., 10 min (step 9). The heat treatment is performed preferably in a hydrogen-containing atmosphere, for example, in an atmosphere of $H_2$: 4%. This heat treatment may be performed immediately after the oxidation treatment or nitridation treatment using a microwave plasma process.

Figure 10:
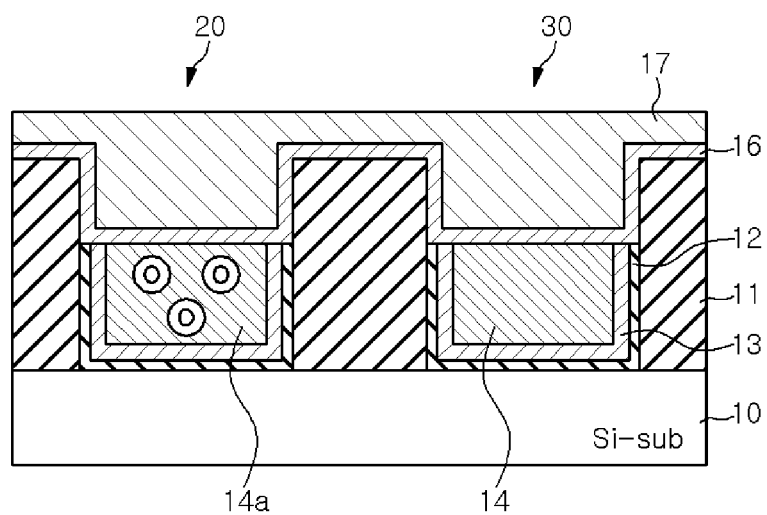
FIG. 10 is a cross-sectional view schematically showing step 10 of the CMOS transistor manufacturing method of FIG. 1.

Next, as shown in FIG. 10, a fourth electrode layer 17 made of a W film is formed on the third electrode layer 16 by CVD (step 10). The W film is formed in a temperature range of 300 to 500° C., e.g., 400° C., to have a film thickness of 1 to 50 nm, e.g., 50 nm.

Thereafter, the gate electrode laminate formed in the pMOS formation region 20 and the nMOS formation region 30 is processed according to a conventional method to form a gate electrode, thereby obtaining a CMOS transistor.

Threshold Control

Next, the threshold control of the transistor will be described in detail.

Figure 11A:
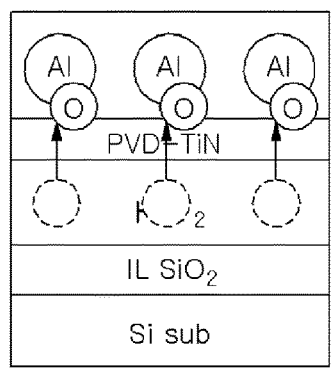
FIGS. 11A and 11B are diagrams explaining the principle of a threshold control of a transistor according to the present disclosure.

In the present embodiment, in the case where the oxidation treatment is not performed on the second electrode layer 14 made of a TiAl film containing Al which is a work function adjusting metal, as shown in FIG. 11A, oxygen in the $HfO_2$ film forming the gate insulating film 12 is drawn to Al in the TiAl film and oxygen deficiency is generated in the $HfO_2$ film. Accordingly, the work function of the TiAl film changes and a threshold voltage Vfb shifts in a negative direction.

Figure 11B:
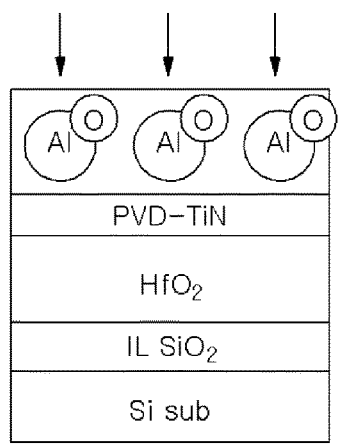

On the other hand, in the case where the second electrode layer 14 made of the TiAl film is oxidized by a microwave plasma, as shown in FIG. 11B, oxygen is selectively added to the second electrode layer 14 made of the TiAl film to inactivate Al, and oxygen is not extracted from the $HfO_2$ film forming the gate insulating film 12. For this reason, oxygen deficiency does not occur in the $HfO_2$ film, and the threshold voltage Vfb does not change.

Therefore, by appropriately controlling the conditions of the oxidation treatment, a portion of the TiAl film serving as the second electrode layer which has not been subjected to the oxidation treatment may be used as the nMOS and the other portion which has been subjected to the oxidation treatment may be used as the pMOS.

In the case of performing the nitridation treatment by a microwave plasma, nitrogen is added to the TiAl film, but Al can be inactivated also by this treatment, and the same effect as the oxidation treatment can be obtained.

Microwave Plasma Processing Apparatus

First Example of Microwave Plasma Processing Apparatus

In order to inactivate Al in the TiAl film, a microwave plasma processing apparatus is used. However, in order to introduce oxygen or nitrogen into the thin TiAl film with a good controllability, it is preferable to perform the oxidation treatment or nitridation treatment by using an RLSA (registered trademark) microwave plasma processing apparatus having a planar antenna with slots formed therein to generate a plasma by radiating microwaves into a processing chamber through the slots.

Figure 12:
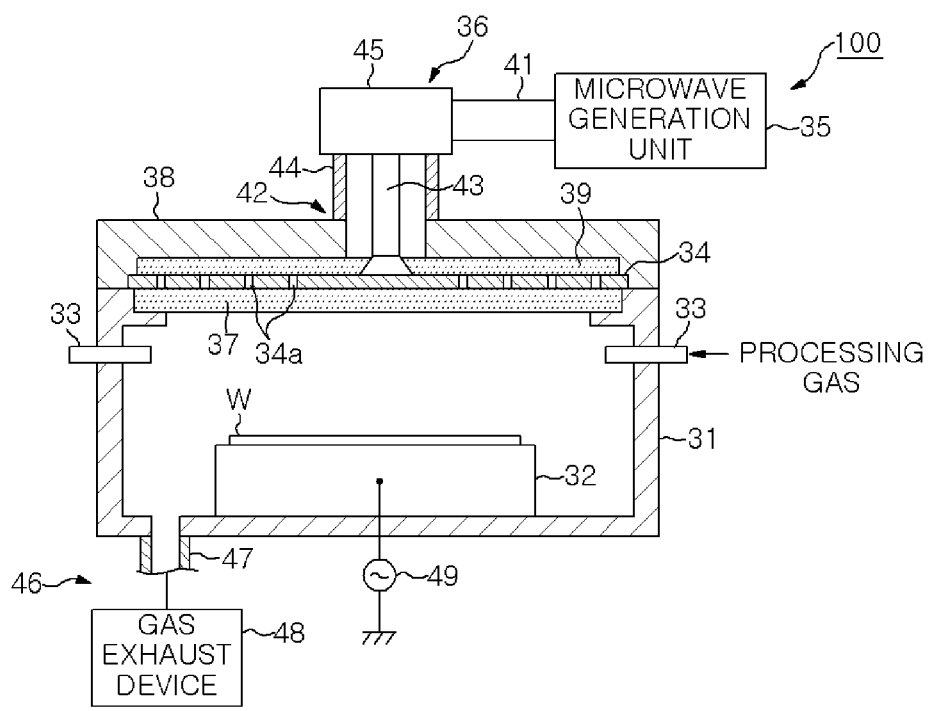
FIG. 12 is a cross-sectional view showing an RLSA (registered trademark) microwave plasma processing apparatus as a first example of a microwave plasma processing apparatus.

FIG. 12 is a cross-sectional view showing an RLSA (registered trademark) microwave plasma processing apparatus as a first example of the microwave plasma processing apparatus. The RLSA microwave plasma processing apparatus 100 includes a substantially cylindrical processing chamber 31, a mounting table 32 provided in the processing chamber 31, a gas inlet 33 provided on a side wall of the processing chamber 31 to introduce a processing gas, a planar antenna 34 disposed to face an opening at the top of the processing chamber 31 and having slots 34a through which microwaves are transmitted, a microwave generation unit 35 for generating microwaves, a microwave transmission mechanism 36 for guiding the microwaves to the planar antenna 34, a microwave transmission plate 37 made of a dielectric material provided on the lower surface of the planar antenna 34, and a gas exhaust unit 46.

A water-cooled shield member 38 is provided above the planar antenna 34, and a retardation member 39 made of a dielectric material is provided between the shield member 38 and the planar antenna 34.

The gas inlet 33 is configured to introduce a plasma generating gas and a processing gas for the oxidation treatment or nitridation treatment into the processing chamber 31. A gas supply pipe (not shown) is connected to the gas inlet 33, and a gas supply source (not shown) for supplying a plasma generating gas and a processing gas for the oxidation treatment or nitridation treatment is connected to the gas supply pipe. Then, these gases are supplied from the gas supply source through the gas supply pipe to the gas inlet 33, and introduced into the processing chamber 31 from the gas inlet 33. As the plasma generating gas, a rare gas such as Ar, Kr, Xe, He or the like is used. As the processing gas, for example, an oxidizing gas such as oxygen gas, ozone gas or the like may be used in the case of the oxidation treatment, and nitrogen gas, ammonia gas or the like may be used in the case of the nitridation treatment.

The microwave transmission mechanism 36 includes a waveguide 41 extending in a horizontal direction to guide microwaves from the microwave generation unit 35, a coaxial waveguide 42 extending upward from the planar antenna 34 and including an inner conductor 43 and an outer conductor 44, and a mode conversion mechanism 45 provided between the waveguide 41 and the coaxial waveguide 42. The frequency of the microwaves may be in a range of 300 MHz to 10 GHz, e.g., 2.45 GHz.

The gas exhaust unit 46 has a gas exhaust pipe 47 connected to a bottom portion of the processing chamber 31 and a gas exhaust device 48 having a vacuum pump and a pressure control valve. The processing chamber 31 is evacuated through the gas exhaust pipe 47 by the vacuum pump of the gas exhaust device 48. The pressure control valve is provided in the gas exhaust pipe 47, and the pressure inside the processing chamber 31 is controlled by the pressure control valve.

The mounting table 32 is provided with a temperature control mechanism (not shown) such that the temperature of a semiconductor substrate W is controlled to a predetermined temperature within a range of 20 to 400° C. In addition, a high frequency power supply 49 for ion attraction is connected to the mounting table 32 so that ions can be drawn to the semiconductor substrate W.

A side wall portion of the processing chamber 31 has a loading/unloading port (not shown) for loading and unloading the semiconductor substrate W between the processing chamber 31 and a transfer chamber adjacent to the processing chamber 31. The loading/unloading port is configured to be opened and closed by a gate valve (not shown).

In the RLSA microwave plasma processing apparatus 100 configured as described above, the semiconductor substrate W is placed on the mounting table 32, and the processing chamber 31 is evacuated such that the pressure therein is maintained at a predetermined level, e.g., 133 Pa or less. In a state where the temperature of the semiconductor substrate W is controlled to a predetermined temperature, the microwaves generated by the microwave generation unit 35 are guided to the planar antenna 34 in a specific mode via the microwave transmission mechanism 36, and supplied uniformly into the processing chamber 31 through the slots 34a of the antenna 34 and the microwave transmission plate 37. The processing gas supplied from the gas inlet 33 is converted into a plasma by the microwaves so that the TiAl film of the semiconductor substrate W is oxidized or nitrided by oxidizing species or nitriding species such as ions and radicals in the plasma to inactivate Al.

In the RLSA microwave plasma processing apparatus, it is possible to obtain a plasma with a high plasma density at a low electron temperature over a wide area immediately below the antenna, and it is possible to perform uniform plasma processing with low power. For example, the power density of the microwaves may be set to 0.035 to 17.5 kW/m$^2$.

Depending on the thickness of the TiAl film, the power density of the microwaves is preferably 0.035 to 3.5 kW/m$^2$ in the case of the oxidation treatment and 7 to 17.5 kW/m$^2$ in the case of the nitridation treatment.

In a case where the TiAl film is as thin as about 3 nm, the nitridation treatment is possible within the above-mentioned power density range, but the oxidation treatment requires an apparatus having a lower power density and a higher controllability.

Second Example of Microwave Plasma Processing Apparatus

As a low-power microwave plasma processing apparatus capable of performing an oxidation treatment with an excellent controllability even for an extremely thin TiAl film having a film thickness of about 3 nm or less, it is effective to use a microwave plasma source including a plurality of compact microwave radiation mechanisms provided with planar antennas having slots.

Hereinafter, such a microwave plasma processing apparatus will be described as a second example.

Figure 13:
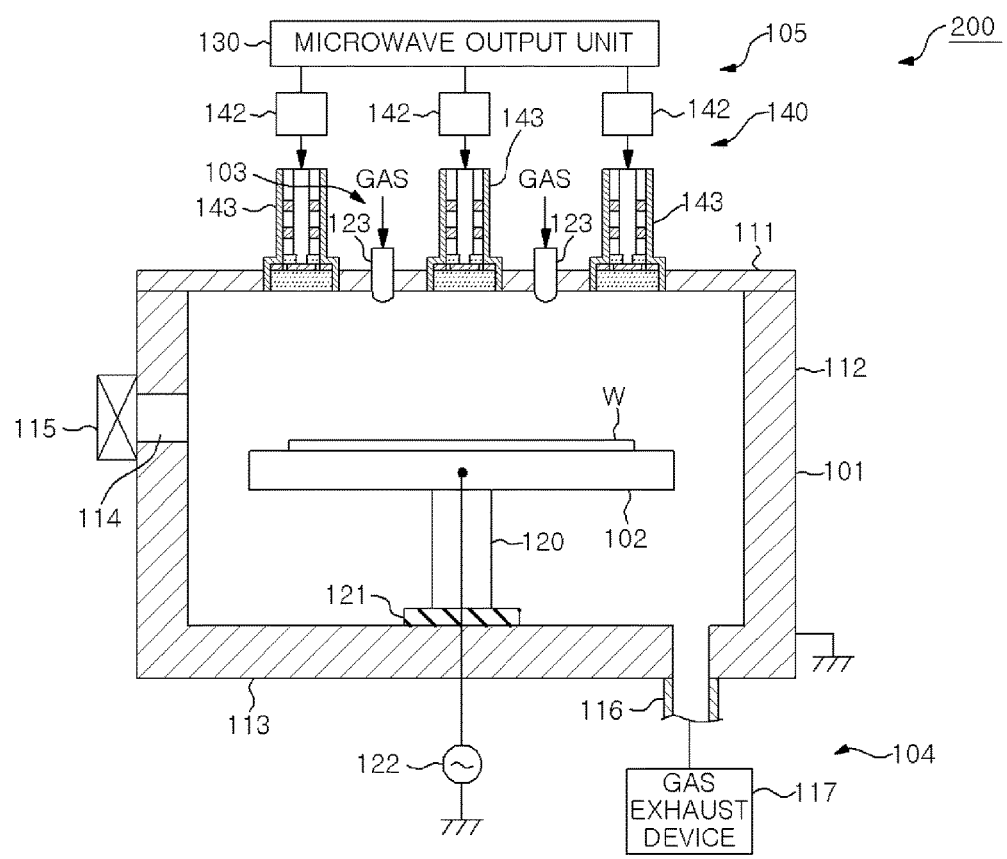
FIG. 13 is a cross-sectional view showing a schematic configuration of a second example of a microwave plasma processing apparatus.
Figure 14:
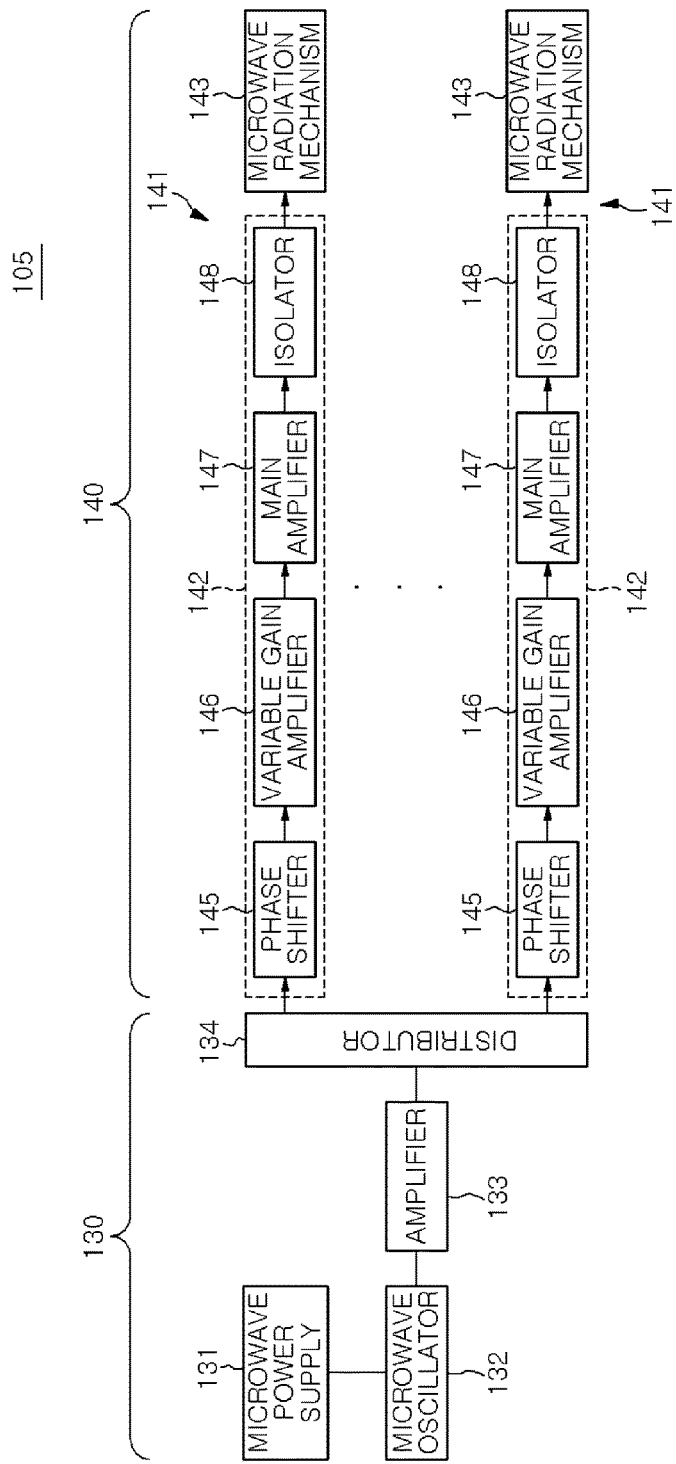
FIG. 14 is a diagram showing a configuration of a microwave introduction device of the microwave plasma processing apparatus of FIG. 13.
Figure 15:
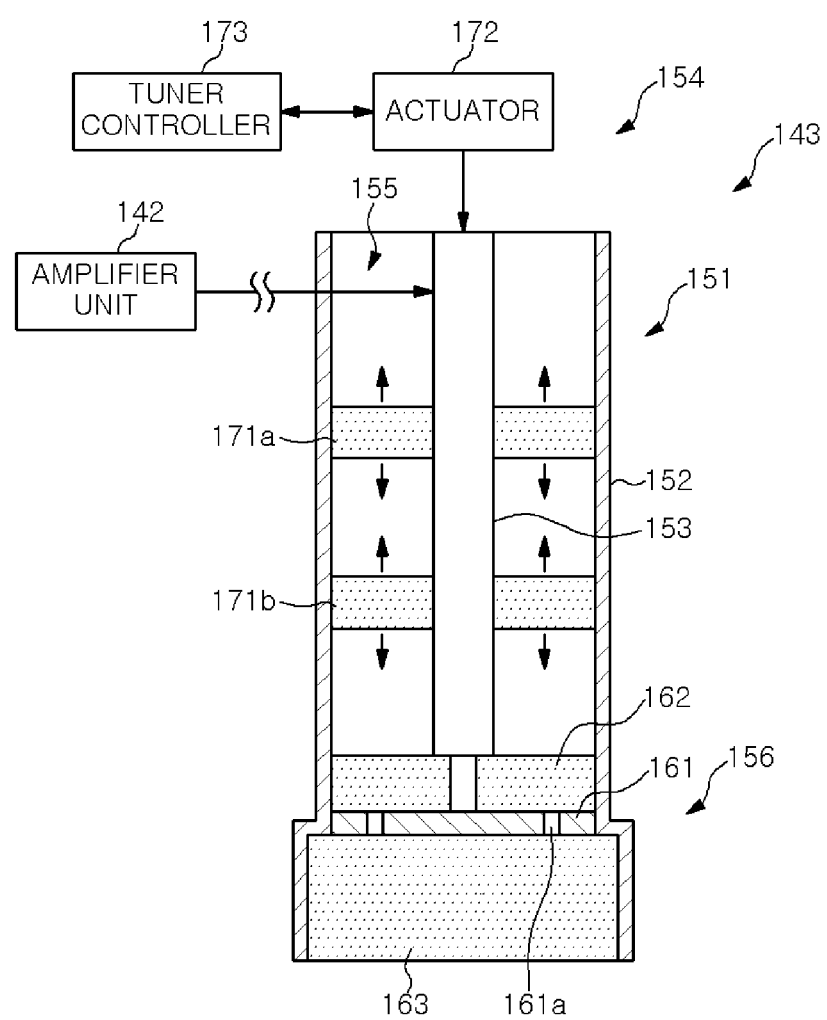
FIG. 15 is a cross-sectional view schematically showing a microwave radiation mechanism in the microwave plasma processing apparatus of FIG. 13.
Figure 16:
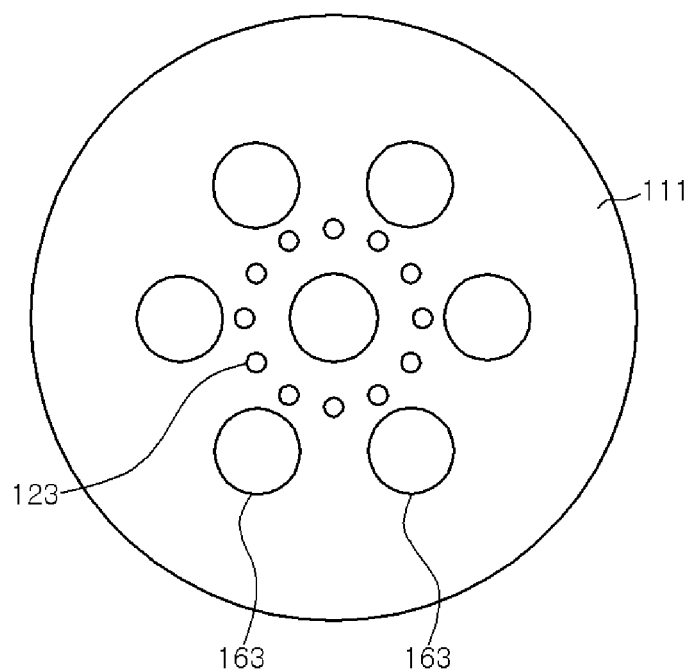
FIG. 16 is a bottom view schematically showing a top wall portion of a processing chamber in the microwave plasma processing apparatus of FIG. 13.

FIG. 13 is a cross-sectional view showing a schematic configuration of a second example of the microwave plasma processing apparatus. FIG. 14 is a configuration diagram showing a configuration of a microwave introduction device of the microwave plasma processing apparatus of FIG. 13. FIG. 15 is a cross-sectional view schematically showing the microwave radiation mechanism in the microwave plasma processing apparatus of FIG. 13. FIG. 16 is a bottom view schematically showing a top wall portion of the processing chamber in the microwave plasma processing apparatus of FIG. 13.

The microwave plasma processing apparatus 200 includes a processing chamber 101 which accommodates a semiconductor substrate W, a mounting table 102 which is disposed inside the processing chamber 101 to mount the semiconductor substrate W thereon, a gas inlet unit 103 which introduces a gas into the processing chamber 101, a gas exhaust unit 104 which evacuates the processing chamber 101, and a microwave introduction device 105 which generates microwaves for generating a plasma in the processing chamber 101 and introduces the microwaves into the processing chamber 101.

The processing chamber 101 is formed of, for example, a metal material such as aluminum and an alloy thereof and has a substantially cylindrical shape. The microwave introduction device 105 is provided above the processing chamber 101 and functions as a plasma generation means for generating a plasma by introducing electromagnetic waves (microwaves) into the processing chamber 101. The configuration of the microwave introduction device 105 will be described later in detail.

The processing chamber 101 includes a top wall portion 111 and a bottom wall portion 113 which have a plate shape, and a side wall portion 112 connecting the top wall portion 111 and the bottom wall portion 113. The top wall portion 111 has a plurality of openings into which the microwave radiation mechanisms and the gas inlet unit to be described later are fitted. The side wall portion 112 has a loading/unloading port 114 for loading and unloading the semiconductor substrate W between the processing chamber 101 and a transfer chamber (not shown) adjacent to the processing chamber 101. The loading/unloading port 114 is opened and closed by a gate valve 115. The gas exhaust unit 104 is provided in the bottom wall portion 113. The gas exhaust unit 104 has a gas exhaust pipe 116 connected to the bottom wall portion 113 and a gas exhaust device 117 having a vacuum pump and a pressure control valve. The processing chamber 101 is evacuated through the gas exhaust pipe 116 by the vacuum pump of the gas exhaust device 117. The pressure control valve is provided in the gas exhaust pipe 116, and the pressure inside the processing chamber 101 is controlled by the pressure control valve. The inside of the processing chamber 101 is depressurized to, e.g., 0.133 Pa by the gas exhaust unit 104.

The mounting table 102 is configured to horizontally support the semiconductor substrate W, and has a disk shape. The mounting table 102 is supported by a cylindrical support member 120 provided at the center of the bottom wall portion 113 of the processing chamber 101 through an insulating member 121.

The mounting table 102 is provided with a temperature control mechanism (not shown) such that the temperature of the semiconductor substrate W is controlled to a predetermined temperature within a range from room temperature to 900° C. In addition, a high frequency power supply 122 for ion attraction is connected to the mounting table 102, so that ions can be drawn to the semiconductor substrate W.

The gas inlet unit 103 is configured to introduce a plasma generating gas and a processing gas for the oxidation treatment or nitridation treatment into the processing chamber 101, and has a plurality of gas introduction nozzles 123. The gas introduction nozzles 123 are fitted into the openings formed in the top wall portion 111 of the processing chamber 101. A gas supply pipe (not shown) is connected to the gas introduction nozzles 123, and a gas supply source (not shown) for supplying a plasma generating gas and a processing gas for the oxidation treatment or nitridation treatment is connected to the gas supply pipe. Then, these gases are supplied from the gas supply source through the gas supply pipe to the gas introduction nozzles 123, and introduced into the processing chamber 101 from the gas introduction nozzles 123. As the plasma generating gas, a rare gas such as Ar, Kr, Xe, He or the like is used. As the processing gas, for example, an oxidizing gas such as oxygen gas, ozone gas or the like may be used in the case of the oxidation treatment, and nitrogen gas, ammonia gas or the like may be used in the case of the nitridation treatment.

As described above, the microwave introduction device 105 is provided above the processing chamber 101 and functions as a plasma generation means for generating a plasma by introducing electromagnetic waves (microwaves) into the processing chamber 101. As shown in FIGS. 13 and 14, the microwave introduction device 105 includes the top wall portion 111 of the processing chamber 101 functioning as a top plate, a microwave output unit 130 for generating microwaves and distributing/outputting the microwaves to a plurality of paths, and an antenna unit 140 for introducing the microwaves outputted from the microwave output unit 130 into the processing chamber 101.

The microwave output unit 130 includes a microwave power supply 131, a microwave oscillator 132, an amplifier 133 for amplifying the microwaves oscillated by the microwave oscillator 132, and a distributor 134 for distributing the microwaves amplified by the amplifier 133 into a plurality of paths. The microwave oscillator 132 oscillates the microwaves (for example, PLL oscillation) at a predetermined frequency (for example, 860 MHz). The frequency of the microwaves is not limited to 860 MHz, and it is possible to use a frequency in the range of 700 MHz to 10 GHz such as 2.45 GHz, 8.35 GHz, 5.8 GHz, 1.98 GHz or the like. The distributor 134 distributes the microwaves while matching the impedance on the input side with the impedance on the output side.

The antenna unit 140 includes a plurality of antenna modules 141. Each of the plurality of antenna modules 141 introduces the microwaves distributed by the distributor 134 into the processing chamber 101. All of the antenna modules 141 have the same configuration. Each of the antenna modules 141 includes an amplifier unit 142 which mainly amplifies and outputs the distributed microwaves and a microwave radiation mechanism 143 which radiates the microwaves outputted from the amplifier unit 142 into the processing chamber 101.

The amplifier unit 142 includes a phase shifter 145 for changing the phase of the microwaves, a variable gain amplifier 146 for adjusting the power level of the microwaves inputted to a main amplifier 147, the main amplifier 147 configured as a solid state amplifier, and an isolator 148 for isolating reflected microwaves which have been reflected from the antenna unit of the microwave radiation mechanism 143 (to be described later) toward the main amplifier 147.

As shown in FIG. 13, a plurality of microwave radiation mechanisms 143 are provided in the top wall portion 111. As shown in FIG. 15, the microwave radiation mechanism 143 includes a coaxial tube 151 having a tubular outer conductor 152 and an inner conductor 153 provided coaxially with the outer conductor 152 in the outer conductor 152 such that a microwave transmission path is formed between them, a power supply unit 155 for feeding the amplified microwaves from the amplifier unit 142 to the microwave transmission path, a tuner 154 for matching the load impedance with the characteristic impedance of the microwave power supply 131, and an antenna unit 156 which radiates the microwaves from the coaxial tube 151 into the processing chamber 101.

The power supply unit 155 is configured such that the microwaves amplified by the amplifier unit 142 are introduced from the side of an upper end portion of the outer conductor 152 through a coaxial cable, and the microwaves are radiated by, e.g., a power supply antenna such that the microwave power is supplied to the microwave transmission path between the outer conductor 152 and the inner conductor 153 and the microwave power is propagated toward the antenna unit 156.

The antenna unit 156 is provided at a lower end portion of the coaxial tube 151. The antenna unit 156 includes a planar antenna 161 having a disk shape connected to a lower end portion of the inner conductor 153, a retardation member 162 disposed on the upper surface side of the planar antenna 161, and a microwave transmission plate 163 disposed on the lower surface side of the planar antenna 161. The microwave transmission plate 163 is fitted into the ceiling wall portion 111, and the lower surface thereof is exposed in an internal space of the processing chamber 101. The planar antenna 161 has slots 161a formed therethrough. The shape of the slots 161a is appropriately set such that the microwaves are radiated efficiently. Dielectrics may be inserted in the slots 161a. The retardation member 162 is formed of a material having a dielectric constant larger than that of vacuum, and the phase of the microwaves can be adjusted by the thickness of the retardation member 162, so that the radiant energy of the microwaves can be maximized. The microwave transmission plate 163 is also made of a dielectric material and has such a shape that microwaves can be efficiently radiated in a TE mode. The microwaves transmitted through the microwave transmission plate 163 generate a plasma in a space inside the processing chamber 101. As the materials forming the retardation member 162 and the microwave transmission plate 163, for example, quartz, ceramics, fluororesin such as polytetrafluoroethylene resin, polyimide resin, or the like may be used.

The tuner 154 constitutes a slug tuner, and includes, as shown in FIG. 15, two slugs 171a and 171b disposed closer to the base end side (upper end side) of the coaxial tube 151 than the antenna unit 156, an actuator 172 for independently driving the two slugs, and a tuner controller 173 for controlling the actuator 172.

The slugs 171a and 171b are formed in an annular plate shape, made of a dielectric material such as ceramic or the like, and disposed between the outer conductor 152 and the inner conductor 153 of the coaxial tube 151. Further, the actuator 172 individually drives the slugs 171a and 171b, for example, by rotating two screws screwed into the slugs 171a and 171b provided inside the inner conductor 153. Then, based on a command from the tuner controller 173, the actuator 172 moves the slugs 171a and 171b in a vertical direction. The tuner controller 173 controls the positions of the slugs 171a and 171b such that the impedance of an end portion becomes 50Ω.

The main amplifier 147, the tuner 154 and the planar antenna 161 are arranged close to each other. The tuner 154 and the planar antenna 161 constitute a lumped constant circuit and function as a resonator. Impedance mismatch exists at an installation portion of the planar antenna 161, but since the impedance is tuned directly with respect to the plasma load by the tuner 154, the impedance of the plasma and the like can be tuned with high precision, and an influence of reflection in the planar antenna 161 can be eliminated.

As shown in FIG. 16, in this example, there are provided seven microwave radiation mechanisms 143, and the microwave transmission plates 163 corresponding thereto are arranged equally in a hexagonal close-packed arrangement. That is, one of the seven microwave transmission plates 163 is disposed at the center of the top wall portion 111, and the other six microwave transparent plates 163 are disposed around the central microwave transmission plate. These seven microwave transmission plates 163 are arranged so that the adjacent microwave transmission plates are equally spaced. The plurality of nozzles 123 of the gas inlet unit 103 are arranged to surround the periphery of the central microwave transmission plate.

Next, a processing operation in the microwave plasma processing apparatus 200 configured as described above will be described.

First, the semiconductor substrate W is loaded into the processing chamber 101, and placed on the mounting table 102. The processing chamber 101 is evacuated, and the pressure therein is maintained at a predetermined level in the range of, e.g., 6 to 600 Pa. The temperature of the semiconductor substrate W is controlled to a predetermined temperature in the range of 20 to 400° C. Then, while introducing a plasma generating gas from the gas introduction nozzles 123 of the gas inlet unit 103, microwaves are introduced from the microwave introduction device 105 into the processing chamber 101, thereby generating a microwave plasma.

When the plasma is ignited, a processing gas for the oxidation treatment or nitridation treatment is introduced into the processing chamber 101 from the gas introduction nozzles 123 of the gas inlet unit 103, the processing gas is converted into a plasma, and the TiAl film of the semiconductor substrate W is oxidized or nitrided by oxidizing species or nitriding species such as ions and radicals in the plasma to inactivate Al.

When generating the microwave plasma, in the microwave introduction device 105, the microwave power oscillated by the microwave oscillator 132 of the microwave output unit 130 is amplified by the amplifier 133 and then distributed plurally by the distributor 134, and the distributed microwave power is led to the antenna unit 140. In the antenna unit 140, the microwave power distributed plurally as described above is individually amplified by the main amplifier 147 constituting the solid state amplifier. The power is supplied to each microwave radiation mechanism 143, is transmitted through the coaxial tube 151 and reaches the antenna unit 156. At that time, the impedance is automatically matched by the slug 171a and the slug 171b of the tuner 154. In a state where there is substantially no power reflection, the microwaves are radiated from the slots 161a of the planar antenna 161 through the retardation member 162 of the antenna unit 156 from the tuner 154, pass through the microwave transmission plate 163, and are transmitted through the surface (lower surface) of the microwave transmission plate 163 in contact with the plasma to form surface waves. Then, the powers in the respective antenna units 156 are spatially combined in the processing chamber 101. Accordingly, a microwave plasma is generated in a space inside the processing chamber 101, and a plasma oxidation treatment or plasma nitridation treatment is performed on the TiAl film of the semiconductor substrate W.

As described above, the plurally distributed microwaves are individually amplified by the main amplifier 147 constituting the solid state amplifier, and introduced individually from the plurality of antenna units 156 into the processing chamber 101 to form surface waves. Then, they are spatially combined to generate a microwave plasma. Thus, a large-sized isolator or combiner becomes unnecessary, which makes the apparatus compact. Further, the main amplifier 147, the tuner 154, and the planar antenna 161 are provided close to each other, and the tuner 154 and the planar antenna 161 constitute a lumped constant circuit and function as a resonator. Accordingly, since the impedance of the plasma and the like can be tuned with high precision by the tuner 154 at an installation portion of the planar antenna where the impedance mismatch exists, it is possible to definitely eliminate the influence of the reflection and realize the plasma control with high precision.

Further, since a plurality of microwave transmission plates 163 are provided, as compared with a single microwave transmission plate 37 in the RLSA microwave plasma processing apparatus of the first example, the total area can be reduced, and the power of the microwaves required for stably igniting and discharging the plasma can be reduced. For example, in the RLSA microwave plasma processing apparatus of the first example, when the diameter of the microwave transmission plate 37 is about 500 mm, the minimum value of the power of the microwaves required for stably igniting and discharging the plasma is about 1000 W and the power density is 0.14 $kW/m^2$ or more. However, in the second example, the diameter of the microwave transmission plate 163 is about 90 to 150 mm, and the power of the microwaves required for stably igniting and discharging the plasma in one microwave radiation mechanism 143 can be set to, e.g., about 7 to 700 W, and the total power of the microwaves required can be set to about 49 to 4900 W. Accordingly, the minimum value of the power density for the semiconductor substrate W can be extremely reduced to 0.035 $kW/m^2$. Therefore, even when the TiAl film is as extremely thin as 3 nm or less, particularly, 1 nm or less, it is possible to inactivate Al with a good controllability.

In the second example, the case where seven microwave radiation mechanisms 143 are provided has been described, but the number of microwave radiation mechanisms is not limited to seven. However, it is preferably 4 or more.

EXPERIMENTAL EXAMPLES

Experimental Example 1

The results of controlling the threshold of the CMOS transistor by performing the oxidation treatment using the microwave plasma processing apparatus of the second example will be described.

In this example, after forming an underlying $SiO_2$ film on a Si substrate, a $HfO_2$ film (thickness: 3.5 nm) was formed by ALD, a cap TiN film (thickness: 1 nm) was formed by PVD, and a TiAl film (thickness: 3 nm) was formed by PVD. Then, an oxidation treatment was carried out while changing the time using the microwave plasma processing apparatus of the second example. Further, a barrier TiN film (thickness: 30 nm) was formed by PVD, and an annealing treatment ($H_2$: 4%) was performed at 400° C. for 10 min.

The conditions for the oxidation treatment were as follows.

Figure 17:
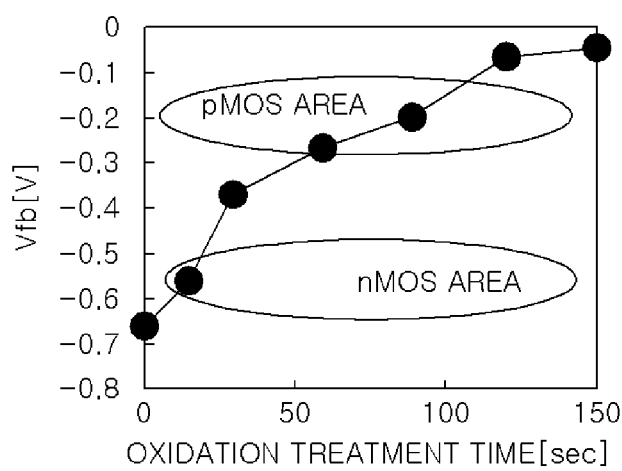
FIG. 17 is a graph showing a relationship between the time of the oxidation treatment using a microwave plasma process and the threshold voltage Vfb of the transistor in Experimental Example 1.

Processing temperature: 300° C.
Pressure inside processing chamber: 133 Pa
Power per microwave radiation mechanism: 30 W (power density: 0.15 kW/m$^2$)
Ar gas flow rate: 990 sccm
O$_2$ gas flow rate: 10 sccm FIG. 17 is a diagram showing a relationship between the time of the oxidation treatment using a microwave plasma process and the threshold voltage Vfb of the transistor. As shown in FIG. 17, it has been confirmed that it is possible to freely control the threshold voltage Vfb of the transistor within a range from the nMOS region to the pMOS region by performing the oxidation treatment with a low power density in the microwave plasma processing apparatus of the second example.

Figure 18:
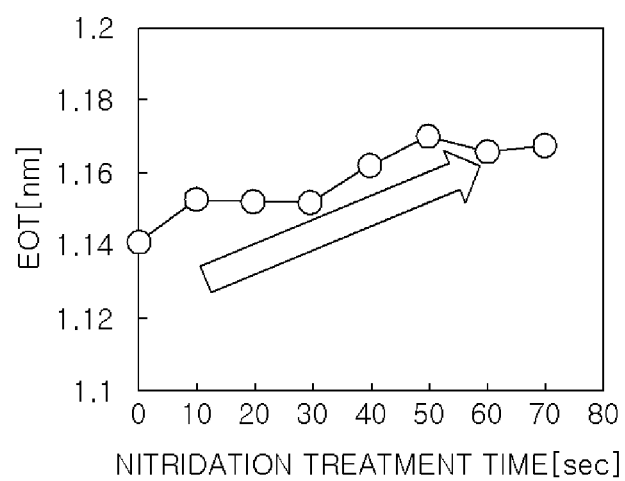
FIG. 18 is a graph showing a change in EOT of the $HfO_2$ film according to the oxidation treatment time in Experimental Example 1.

FIG. 18 shows a change in the equivalent oxide thickness (EOT) of the HfO$_2$ film according to the oxidation treatment time in this case. As shown in FIG. 18, it has been confirmed that an increase/decrease of the EOT was small.

Figures 19A, 19B, 19C:
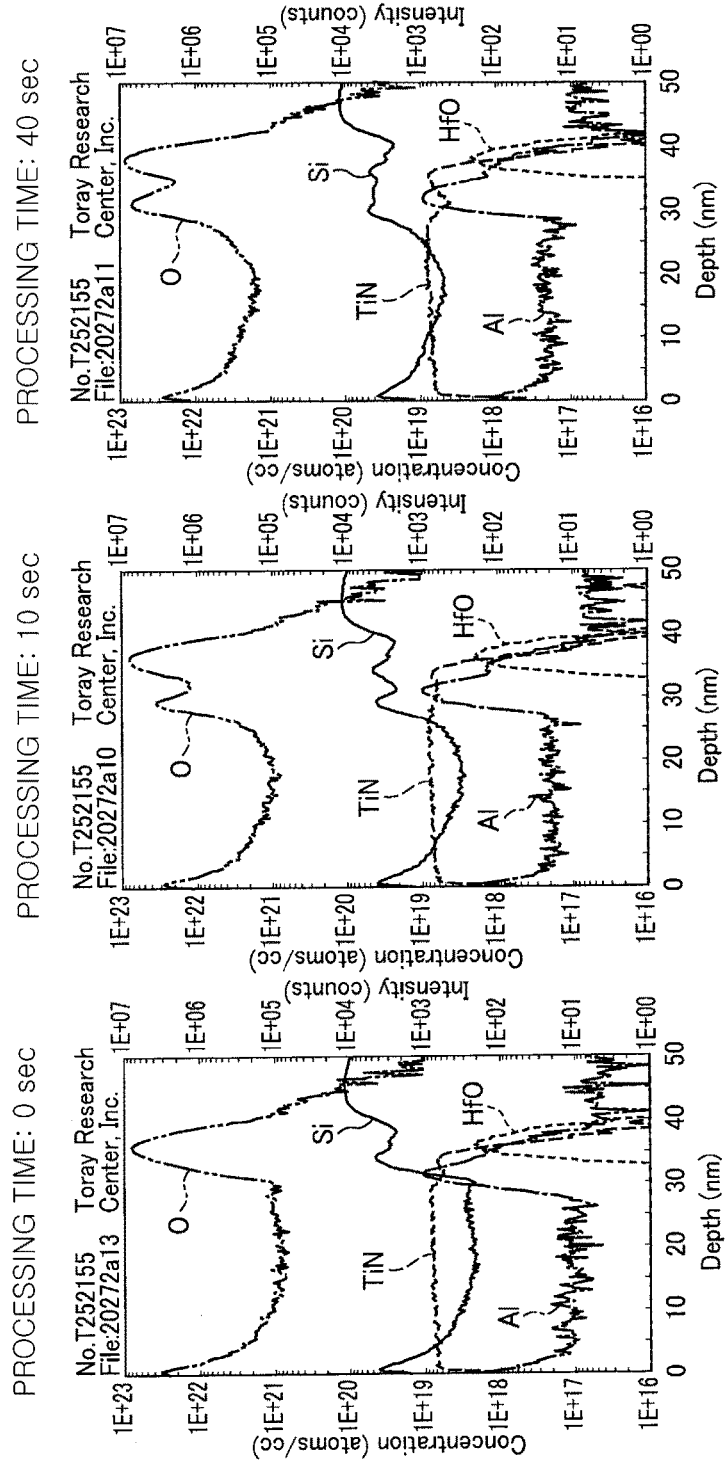

FIGS. 19A to 19C show the results of X-ray photoelectron spectroscopy (XPS) analysis in a depth direction from the barrier TiN film side to the Si substrate side with respect to the laminate when the oxidation treatment time of the TiAl film using the microwave plasma processing apparatus is changed, wherein FIG. 19A shows the result of the processing time: 0 sec, FIG. 19B shows the result of the processing time: 10 sec, and FIG. 19C shows the result of the processing time: 40 sec. As shown in FIGS. 19A to 19C, it has been confirmed that oxygen was selectively introduced into a very thin TiAl film having a film thickness of 3 nm by performing the oxidation treatment in the microwave plasma processing apparatus of the second example.

Experimental Example 2

The results of controlling the threshold of the CMOS transistor by performing the nitridation treatment using the microwave plasma processing apparatus of the second example will be described.

In this example, after forming an underlying SiO$_2$ film on a Si substrate, a HfO$_2$ film (thickness: 3.5 nm) was formed by ALD, a cap TiN film (thickness: 1 nm) was formed by PVD, and a TiAl film (thickness: 3 nm) was formed by PVD. Then, a nitridation treatment was carried out while changing the time using the microwave plasma processing apparatus of the second example. Further, a barrier TiN film (thickness: 30 nm) was formed by PVD, and an annealing treatment (H$_2$: 4%) was performed at 400° C. for 10 min.

The conditions for the nitridation treatment were as follows.

Figure 20:
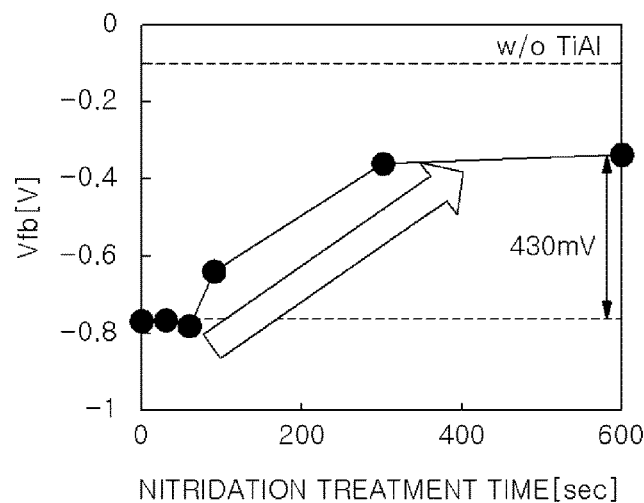
FIG. 20 is a graph showing a relationship between the time of the nitridation treatment using a microwave plasma process and the threshold voltage Vfb of the transistor in Experimental Example 2.

Processing temperature: 300° C.
Pressure inside processing chamber: 13.3 Pa
Power per microwave radiation mechanism: 400 W (power density: 2 kW/m$^2$)
Ar gas flow rate: 1000 sccm
N$_2$ gas flow rate: 200 sccm FIG. 20 is a diagram showing a relationship between the time of the nitridation treatment using a microwave plasma process and the threshold voltage Vfb of the transistor. As shown in FIG. 20, it has been confirmed that it is possible to control the threshold voltage Vfb of the transistor within a range from the nMOS region to the pMOS region by performing the nitridation treatment in the microwave plasma processing apparatus of the second example. At that time, the microwave power is 400 W per each microwave radiation mechanism and 2800 W in total, which is sufficiently feasible even in the case of using the RLSA microwave plasma processing apparatus of the first example.

Figure 21:
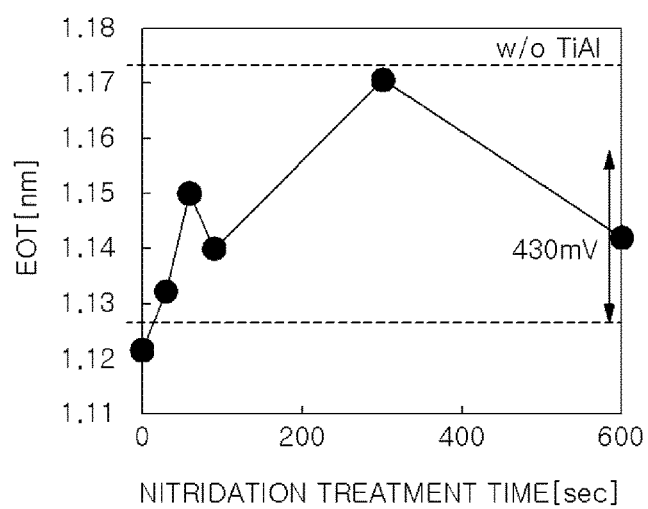
FIG. 21 is a graph showing a change in EOT of the $HfO_2$ film according to the nitridation treatment time in Experimental Example 2.

FIG. 21 shows a change in the equivalent oxide thickness (EOT) of the HfO$_2$ film according to the nitridation treatment time in this case. As shown in FIG. 21, it has been confirmed that an increase/decrease of the EOT was small. The EOT decreases at 300 sec or more, and it is assumed that N is introduced into the HfO$_2$ film at 300 sec or more.

Other Applications

The present disclosure is not limited to the above-described embodiment and can be variously modified within the scope of the present disclosure. For example, in the above embodiment, the present disclosure has been applied to the manufacture of the CMOS transistor, but the present disclosure is not limited thereto and can be applied to the threshold control of the MOS transistor.

Further, the laminated structure of the gate electrode is not limited to the above-described embodiment, and a necessary number of electrode layers may be formed as required.

While the disclosure has been shown and described with respect to the embodiments, it will be understood by those skilled in the art that various changes and modification may be made without departing from the scope of the disclosure as defined in the following claims.

What is claimed is:

1. A method of fabricating a transistor with a controlled threshold voltage, the method comprising:
    forming a gate insulating film in channel regions of a metal-oxide-semiconductor (MOS) transistor on a main surface of a semiconductor substrate;
    forming a first electrode layer on the gate insulating film;
    forming a second electrode layer containing a work function adjusting metal on the first electrode layer; and
    thereafter, controlling the threshold voltage of the MOS transistor by performing an oxidation treatment or a nitridation treatment on the second electrode layer by using a microwave plasma processing apparatus to inactivate the work function adjusting metal.

2. The method of claim 1, wherein the second electrode layer comprises Al as the work function adjusting metal.

3. The method of claim 2, wherein the gate insulating film is a HfO$_2$ film, the first electrode layer is a TiN film, and the second electrode layer is formed of a TiAl film.

4. The method of claim 1, wherein the microwave plasma processing apparatus comprises a planar antenna having slots, wherein the performing the oxidation treatment or the nitridation treatment comprises:
    transmitting microwaves of a predetermined power through the slots of the planar antenna and a microwave transmission plate made of a dielectric material to introduce the microwaves into a processing chamber in which the semiconductor substrate is disposed, and
    oxidizing or nitriding the second electrode layer of the semiconductor substrate by using a microwave plasma generated by the microwaves.

5. The method of claim 1, wherein the microwave plasma processing apparatus comprises a plurality of microwave radiation mechanisms, each including; a tuner perform impedance matching; a planar antenna having slots for radiating the supplied microwaves; and a microwave transmission plate made of a dielectric material disposed adjacent to the planar antenna, and
    wherein the performing the oxidation treatment or the nitridation treatment comprises:

transmitting microwaves of a predetermined power are transmitted through the slots and the microwave transmission plates of the microwave radiation mechanisms and introducing the microwaves into a processing chamber in which the semiconductor substrate is disposed; and oxidizing or nitriding the second electrode layer of the semiconductor substrate by using a microwave plasma generated by the microwaves.

6. The method of claim 5, wherein the second electrode layer has a thickness of 3 nm or less, and the microwave plasma is used for the oxidation treatment.

7. A method of manufacturing a semiconductor device, the method comprising:
preparing a semiconductor substrate having on its main surface a first region in which a first conductive type channel is formed and a second region in which a second conductive type channel is formed;
forming a gate insulating film in the first region and the second region;
forming a first electrode layer on the gate insulating film;
forming a second electrode layer comprising a work function adjusting metal on the first electrode layer; and
controlling a threshold voltage of the first region by performing an oxidation treatment or a nitridation treatment only on the first region of the second electrode layer by using a microwave plasma processing apparatus to inactivate the work function adjusting metal.

8. The method of claim 7, wherein the second electrode layer comprises Al as a work function adjusting metal.

9. The method of claim 8, wherein the gate insulating film is a $HfO_2$ film, the first electrode layer is a TiN film, and the second electrode layer is formed of a TiAl film.

10. The method of claim 7, wherein the microwave plasma processing apparatus comprises a planar antenna having slots, and wherein the performing the oxidation treatment or the nitridation treatment comprises:
transmitting microwaves of a predetermined power through the slots of the planar antenna and a microwave transmission plate made of a dielectric material to introduce the microwaves into a processing chamber in which the semiconductor substrate is disposed; and oxidizing or nitriding the second electrode layer of the semiconductor substrate by using a microwave plasma generated by the microwaves.

11. The method of claim 7, wherein the microwave plasma processing apparatus comprises a plurality of microwave radiation mechanisms, each including a tuner operable to perform impedance matching; a planar antenna having slots for radiating the supplied microwaves; and a microwave transmission plate made of a dielectric material adjacent to the planar antenna, and
wherein microwaves of a predetermined power are transmitted through the slots and the microwave transmission plates of the microwave radiation mechanisms and introduced into a processing chamber in which the semiconductor substrate is disposed, and the second electrode layer of the semiconductor substrate is oxidized or nitrided by a microwave plasma generated by the microwaves.

12. The method of claim 11, wherein the second electrode layer has a thickness of 3 nm or less, and the microwave plasma is used for the oxidation treatment.

13. The method of claim 1, wherein the oxidation treatment or the nitridation treatment is performed when a microwave plasma is generated.

14. The method of claim 7, wherein the oxidation treatment or the nitridation treatment is performed when a microwave plasma is generated.

15. The method of claim 1, wherein the channel regions comprise a first region in which a first conductive type channel is formed and a second region in which a second conductive type channel is formed, and the oxidation treatment or the nitridation treatment is performed only on the first region of the second electrode layer to control the threshold voltage of the MOS transistor.

16. The method of claim 1, wherein the channel regions comprise a first region in which a first conductive type channel is formed and a second region in which a second conductive type channel is formed, and the oxidation treatment or the nitridation treatment is performed on both the first region and the second region, and an amount of oxygen or nitrogen to be added is greater in the first region than in the second region to control the threshold voltage of the MOS transistor.

* * * * *